United States Patent [19]

Sliwa, Jr.

[11] 4,322,737

[45] Mar. 30, 1982

[54] INTEGRATED CIRCUIT MICROPACKAGING

[75] Inventor: John W. Sliwa, Jr., Stanford, Calif.

[73] Assignee: Intel Corporation, Santa Clara, Calif.

[21] Appl. No.: 96,211

[22] Filed: Nov. 20, 1979

[51] Int. Cl.³ .................. H01L 23/02; H01L 25/04; H01L 23/48

[52] U.S. Cl. ........................... 357/82; 357/59; 357/81; 357/65

[58] Field of Search .............. 357/74, 81, 82, 59, 357/65; 174/52 S

[56] References Cited

U.S. PATENT DOCUMENTS

| | | | |
|---|---|---|---|
| 3,673,306 | 6/1972 | Kirkpatrick | 357/82 |
| 4,047,198 | 9/1977 | Sekhon et al. | 357/82 |
| 4,200,472 | 4/1980 | Chappell et al. | 357/82 |

FOREIGN PATENT DOCUMENTS 2441613 3/1976 Fed. Rep. of Germany ........ 357/82

OTHER PUBLICATIONS

*IBM Technical Disclosure Bulletin*; Modular Organic Carrier by Arvanitakis; vol. 19, No. 9, Feb. 1977, pp. 3321–3322.

*IBM Technical Disclosure Bulletin*; Liquid Cooling of I-C Chips by Anacker; vol. 20, No. 9, Feb. 1978, pp. 3742–3743.

*Primary Examiner*—Andrew J. James
*Attorney, Agent, or Firm*—Blakely, Sokoloff, Taylor & Zafman

[57] ABSTRACT

Thermal dissipation problems characteristic of micropackaging applications in integrated circuits can be eliminated by the use of a semiconductor heat pipe package. Additionally, the heat pipe package as herein disclosed can be employed for the creation of substantially constant temperature surfaces. In applications where a device requires controlled temperatures in order to achieve optimum operation, such as in photo voltaic converters, the packaging of the present invention provides a means for such temperature control. The heat pipe package comprises, in its simplest form, a closed vessel or box containing a heat transferring fluid. In its liquid state, the heat transferring fluid is transported along the interior surfaces of the box by means of a plurality of microgrooves through capillary action. The interior cavity of the heat pipe package or box provides a means for transport of the heat transferring fluid in the vapor state. The integrated circuits may be disposed in the semiconductor surface of the package itself, or mounted as dies in high density. The large number of intercommunications which are required between the high density of integrated circuits included with the micropackaging can be achieved by a combination of optical and electrical communication lines or buses.

30 Claims, 32 Drawing Figures

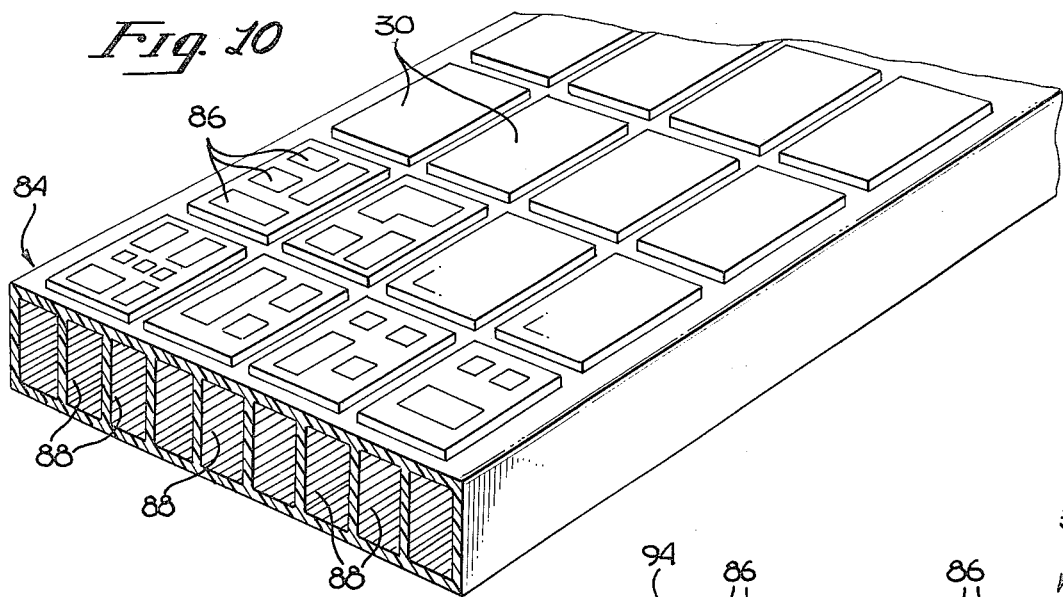
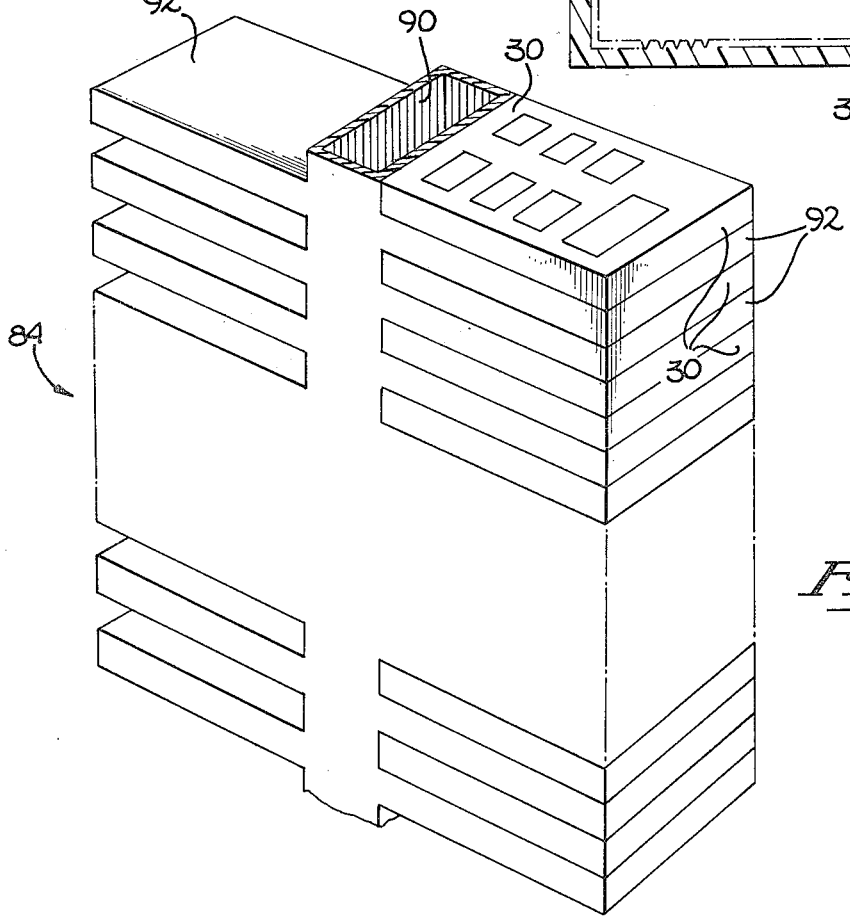

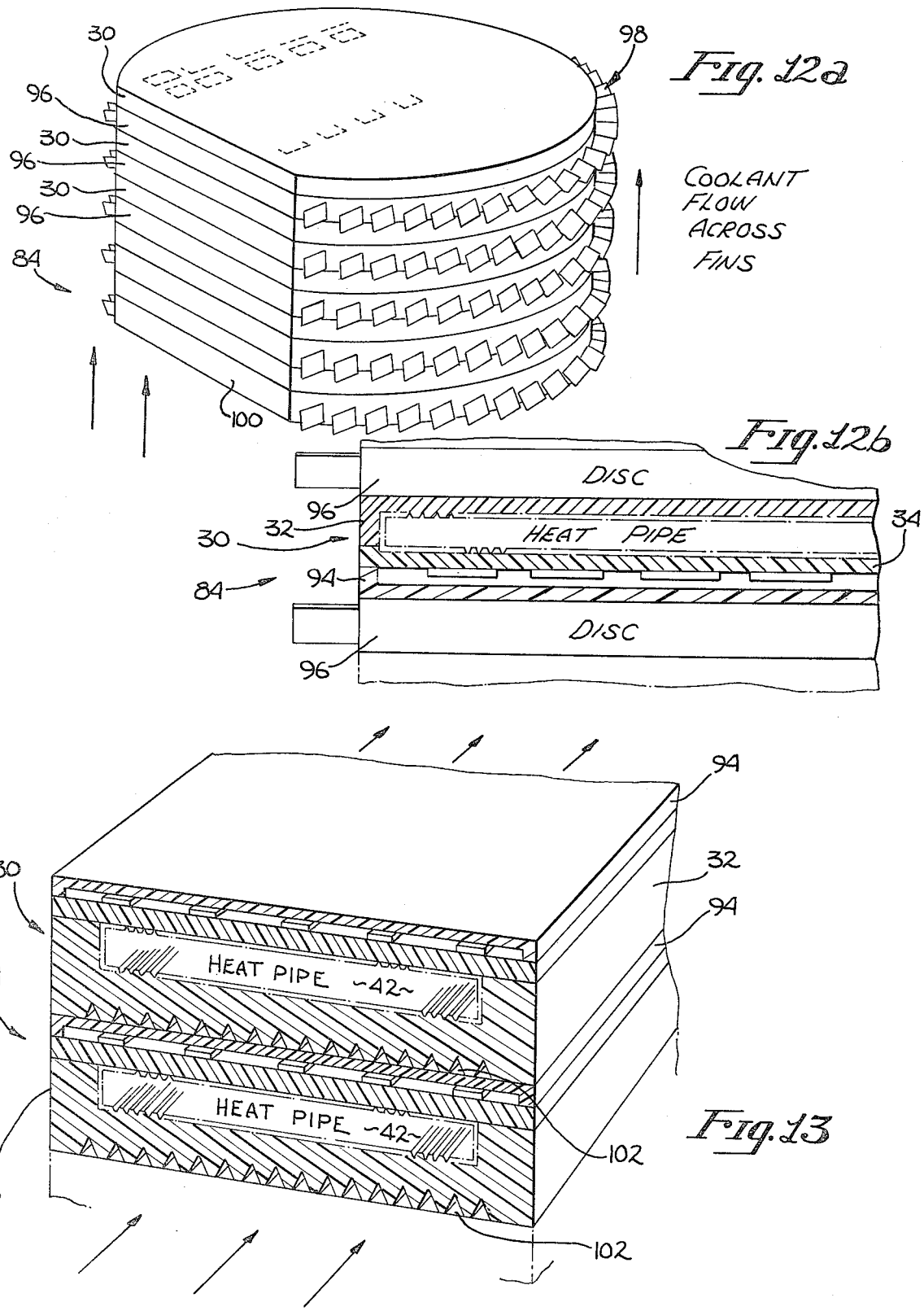

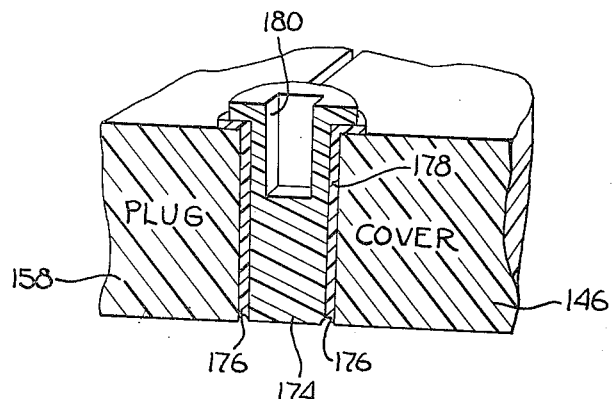
Fig.27
Fig.28
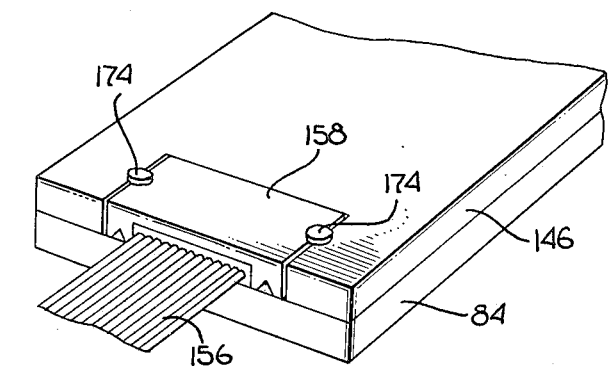
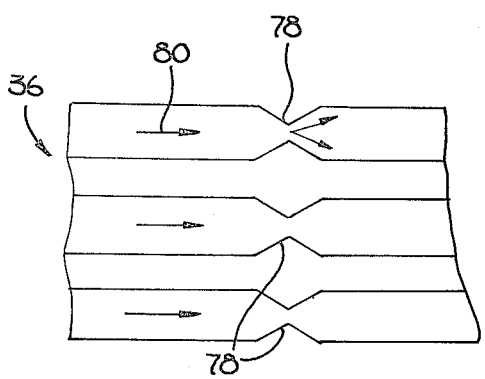
Fig.14b
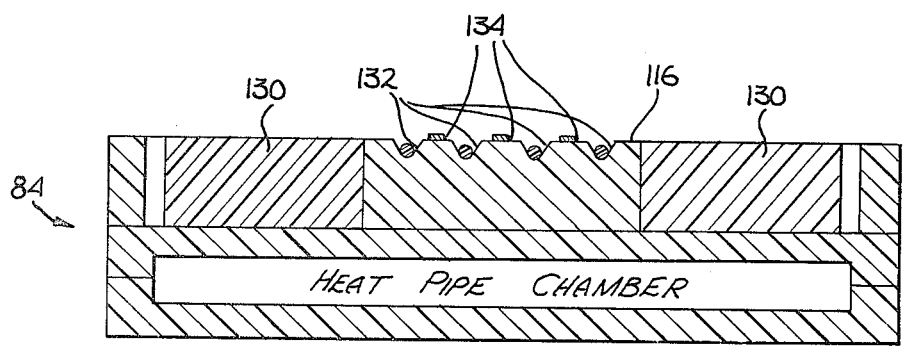
Fig.17b

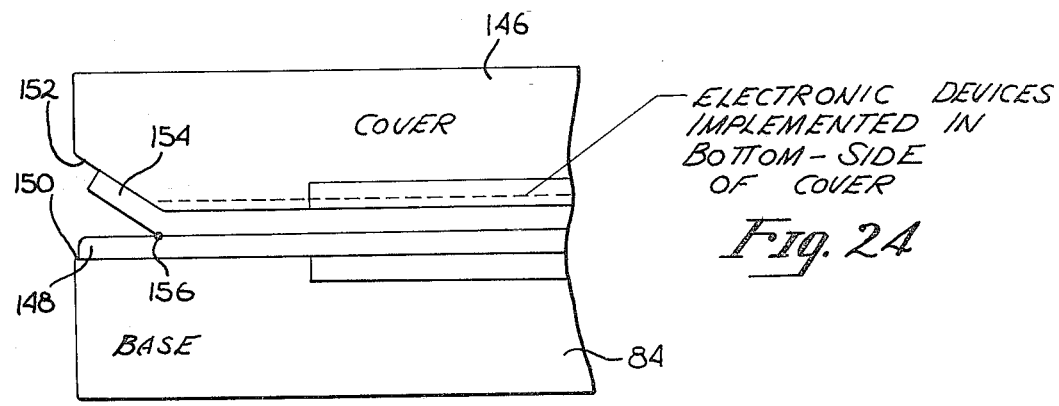
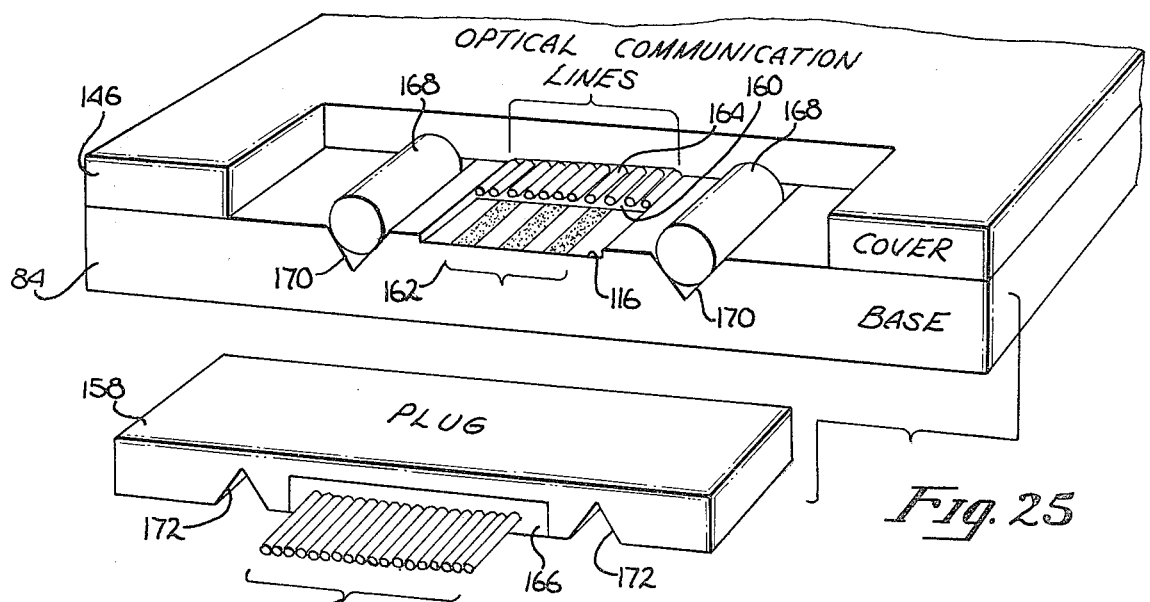
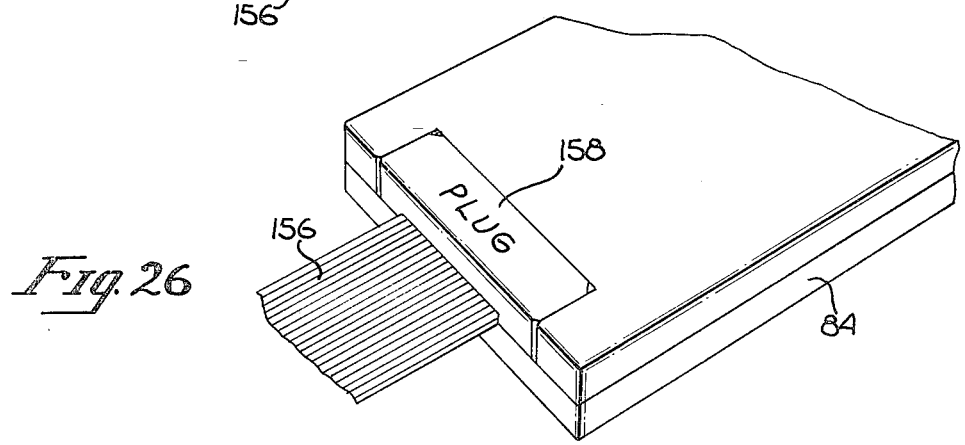

INTEGRATED CIRCUIT MICROPACKAGING

BACKGROUND OF THE INVENTION

1. Field of the Invention

The field of the present invention is in the field of semiconductor integrated circuit packaging and, more particularly, deals with packaging of multiple integrated circuits and the control of package temperatures.

2. Prior Art

Heat pipes are well-known in thermomechanical applications, typically involving large industrial apparatus and engines. The conventional, thermomechanical heat pipe consists of a closed container, typically a steel pipe, which has disposed within the interior of the pipe a fibrous or wick material which is saturated by a fluid, typically water, alcohol or some other fluid havng the appropriate vaporization point and latent heats. Heat applied to one portion of the pipe causes the fluid in the adjacent wick material to be vaporized and escape to an interior cavity within the pipe which is devoid of wick material. The liquid lost from the wick material at the point of application of heat is replaced by fluid from adjoining portions of wick material through capillary action. The heated and vaporized fluid travels by convection to a cooler portion of the heat pipe where it condenses and is reabsorbed into adjacent wick material. In this manner, heat is removed from one location and deposited in a cooler location by means of the thermal circuit.

More recently, the thermomechanical heat pipe has been applied to thermal applications in electronic packaging, A. Basiulis and K. S. Sekhon (Hughes Aircraft), "Heat Pipes in Electronic Packaging", *Electronic Packaging and Production* (Nov. 1978). However, prior art applications of heat pipes to electronic packaging have either been afterthoughts at the device level or have involved large components, each of which supports numerous small heat dissipators or a very few large dissipators. The bulk of prior art devices involves large heat pipes in plate or rod form utilized as thermal sinks for discrete dissipators.

Prior art devices do not include methods of integrating electronic device fabrication and device packaging in such a way that the materials and fabrication technologies associated with device fabrication are either simultaneously, or in parallel, employed to fabricate packages with heat pipe capability. Present art treats device fabrication and device packaging as separate operations utilizing entirely different materials and processes. Packaging generally employs materials such as metals, polymers, ceramics and glases while device fabrication employs mainly semiconductors such as silicon and germanium with their associated dopants, metallizations and passivations. However, new device technologies such as magnetic bubble memories increasingly involve not just conventional materials such as those mentioned but others such as garnet which, for the sake of brevity, will be treated herein under the loose descriptive grouping of semiconductor or semiconductive materials even though they don't meet the technical definition of the term in a formal sense. In order to achieve increasingly necessary improvements in device packaging density in terms of functions and power per unit (volume), problems of thermal dissipation, device intercommunication and interfacing must be overcome. It is the purpose of this application to outline solutions to these problems.

What is needed is some means of utilizing the desirable and beneficial performance capabilities of heat pipes in the field of semiconductor device packaging in an integral manner such that the materials and fabrication technology utilized in circuit manufacturing are either simultaneously, or in parallel, used to manufacture the required packaging as well. This integration will allow heat pipe theoretical performance limits to be achieved in packaging and simultaneously make possible the solution of otherwise untenable interconnection and interfacing problems.

BRIEF SUMMARY OF THE INVENTION

The present invention is an apparatus comprisng a closed container having an interior and exterior surface. A plurality of grooves are defined at least in part on the interior surface of a closed container. A fluid is disposed in the closed container thereby wetting at least part of the plurality of grooves. The closed container is comprised of a semiconductive material and at least part of the interior surface thereof, where the grooves are defined, is monocrystalline.

The interior surface of the closed container has, in one embodiment, a film disposed on the grooves whereby the wetting and capillary properties of the grooves may be controlled and improved and, if necessary, the stress concentration factors associated with such sharply defined grooves in brittle-like materials may be reduced. Additionally, the plurality of grooves are formed mainly in monocrystalline semiconductor material by preferential etching or removal of the monocrystalline material from the monocrystalline portion of the closed container.

In a further embodiment, a power or thermally dissipating device may be defined and disposed in the interior or exterior surface of the closed container, typically in that portion of the closed container having a monocrystalline structure.

In another embodiment, the present invention comprises a carrying apparatus for temperature control of a plurality of integrated circuits, which carrying apparatus has a plurality of heat-transferring apparatus disposed thereon wherein each of the heat transferring apparatus comprises a closed container havng an interior and exterior surface, a plurality of grooves defined at least in part on the interior monocrystalline surface, and a first fluid disposed in the closed container whereby a plurality of grooves are at least in part wetted by the first fluid. The carrying apparatus includes means for transferring heat to and from each one of the plurality of heat transferring apparatus. The means for transferring heat is in thermal contact with each one of the plurality of heat transferring apparatus. By reason of this combination of elements, the plurality of heat transferring apparatus may be disposed in a high density array wherein thermal gradients due to the variation in power dissipated from one heat transferring apparatus to another can be reduced and, as a result, the surface temperature of the carrying apparatus can be held substantially uniform.

In another embodiment of the present invention, selected enclosed grooves defined in monocrystalline semiconducting container surfaces have a varying cross-sectional area, thereby providing a microlocalized adiabatic cooling effect in those areas adjacent to a relatively more constricted area through which a pumped fluid vapor or gas flows and expands upon emergence.

The present invention also includes a macro-package for a plurality of electrical devices comprising a base and a cover disposed over the base. The base has a plurality of cavities defined therein wherein at least one of the cavities has at least one means for communication disposed on the base and leading to a portion of the periphery of the cavity. Each cavity within the base is arranged and configured with the disposition of at least one of the plurality of electrical devices therein.

In one embodiment of this package, the base and cover are monocrystalline at least in those portions of the base and cover surfaces wherein means for communication is disposed.

In another embodiment of this package, the base is monocrystalline at least in that portion of the base wherein the cavities are defined and the plurality of cavities are formed by preferential etching or removal.

The means for communication included within the package of the present invention includes electrically conductive means for the transmission of electrical signals and optically conductive means for the transmission of optical signals. The communication means lead to an edge of at least one of the cavities whereby a die, which includes one of the electrical devices, is provided with a mating means for both interfacing and communication, thereby substantially eliminating conventional tape or wire bonding in order to couple the electrical device to the communication means. In a further embodiment of this package, each base cavity is serviced by a signal conversion means which converts electronic and/or optical signals to their desired form for acceptance by either the disposed die or by the base communication means, said conversion means either being integrated into the base material adjacent to appropriate cavities or disposed in die form adjcent to appropriate cavities. Thus in this embodiment disposed electrical devices in cavities interface with said conversion means which in turn interface with said communication line terminations.

The present invention also includes a temperature controlled surface comprised of a single or multiple layer plate having a plurality of grooves defined therein for the passage of fluid or gas therethrough. The grooves are formed in a portion of the plate which is monocrystalline, which grooves are formed by preferential etching or removal of the monocrystalline material. The grooves defined in the plate are closed by an adjacent plate or by juxtaposition and contact of the groove plate with an object whose temperature is to be controlled.

These and many other embodiments of the present invention are described in the Detailed Description of the Preferred Embodiments and are best understood in light of the FIGURES described below.

BRIEF DESCRIPTION OF THE DRAWINGS

FIG. 10 is a cross-sectional perspective view of the carrying apparatus of the present invention wherein a plurality of semiconductor heat pipes have been mounted, each of the plurality of heat pipes having power dissipating devices disposed on or in their surfaces.

FIG. 11a is another embodiment of the carrying apparatus of the present invention particularly characterized by a central conduit and perpendicularly extending members which are in thermal contact with the individual semiconductor heat pipes.

FIG. 11b is a detailed partial cross-section of one of the semiconductor heat pipes illustrated in FIG. 10 or 11a wherein an additional packaging cover has been added to the semiconductor heat pipe to protect the plurality of integrated circuits disposed therein or thereon.

FIG. 12a is yet another embodiment of the carrying apparatus of the present invention showing a plurality of stacked semiconductor wafers of the type illustrated in FIG. 6 with alernate heat conductive, finned discs.

FIG. 12b is a magnified partial cross-section of a stack of alternating finned discs and covered semiconductor heat pipe packages of the covered construction of FIG. 11b, or of the uncovered water contruction of FIGS. 6 and 12a (not shown).

FIG. 13 is another embodiment of the carrying apparatus of the present invention wherein the semiconductor heat pipes are provided on one external surface with a second plurality of grooves in combination with an adjacent additional cover similar to that used in FIG. 11b wherein a temperature-controlled surface is provided for each semiconductor heat pipe.

FIG. 14b is a plan view of a groove modification for the type of temperature controlled plate of FIG. 14a. The constriction in groove cross-sectional area forms an expansion nozzle and localized microrefrigeration results due to adiabatic expansion of the pumped coolant passing through the constriction. Thus heat removal is bolstered at nozzle locations placed in high thermal dissipation locations.

FIG. 17b is a cross-section taken through a pair of cavities in FIG. 17a showing in detail the combined electrical and optical bus organization for the communication means.

FIG. 18 illustrates the disposition of a single optical fiber within the communication means of FIG. 17a.

FIG. 24 illustrates one means by which a cover may be disposed upon the base of the packaging of FIG. 17a whereby electrical connection and communication is made at the edge of the cover-base interface with an integrated circuit disposed in a monocrystalline portion of the cover.

FIG. 25 illustrates an exploded perspective view of a mechanical mating plug whereby the electrical and/or optical lines in the base communication means are connected from the packaging of FIG. 17a and 17b to an external electro-optical ribbon.

FIG. 26 illustrates the assembled connection of the plug and mating receptacle of FIG. 25.

FIG. 27 illustrates the semi-permanent connection of the plug of FIG. 25 to the packaging by means of insertion pins.

FIG. 28 is a cross-section of an insertion pin of FIG. 27 showing its relationship to the plug and package cover and its breakaway bonding material.

DETAILED DESCRIPTION OF THE PREFERRED EMBODIMENTS

A. SEMICONDUCTOR HEAT PIPES AND PACKAGING APPLICATIONS

The present invention is an apparatus for packaging high massed densities of semiconductor integrated circuits in an integral fashion using largely conventional semiconductor fabrication technology. By the means included within the present invention, high accumulations of thermal energy which are inherent to the high density massing of integrated circuits are substantially eliminated and controlled. In addition, the present invention includes means for inercommunication between packaged integrated circuits themselves and between packaged integrated circuits and external users or peripherals. As a result of the solutions provided by the present invention, the limitations imposed by the prior art packaging of integrated circuit semiconductor devices by reason of excessive accumulation of heat and limited package pin capacity are eliminated.

Figure 1:
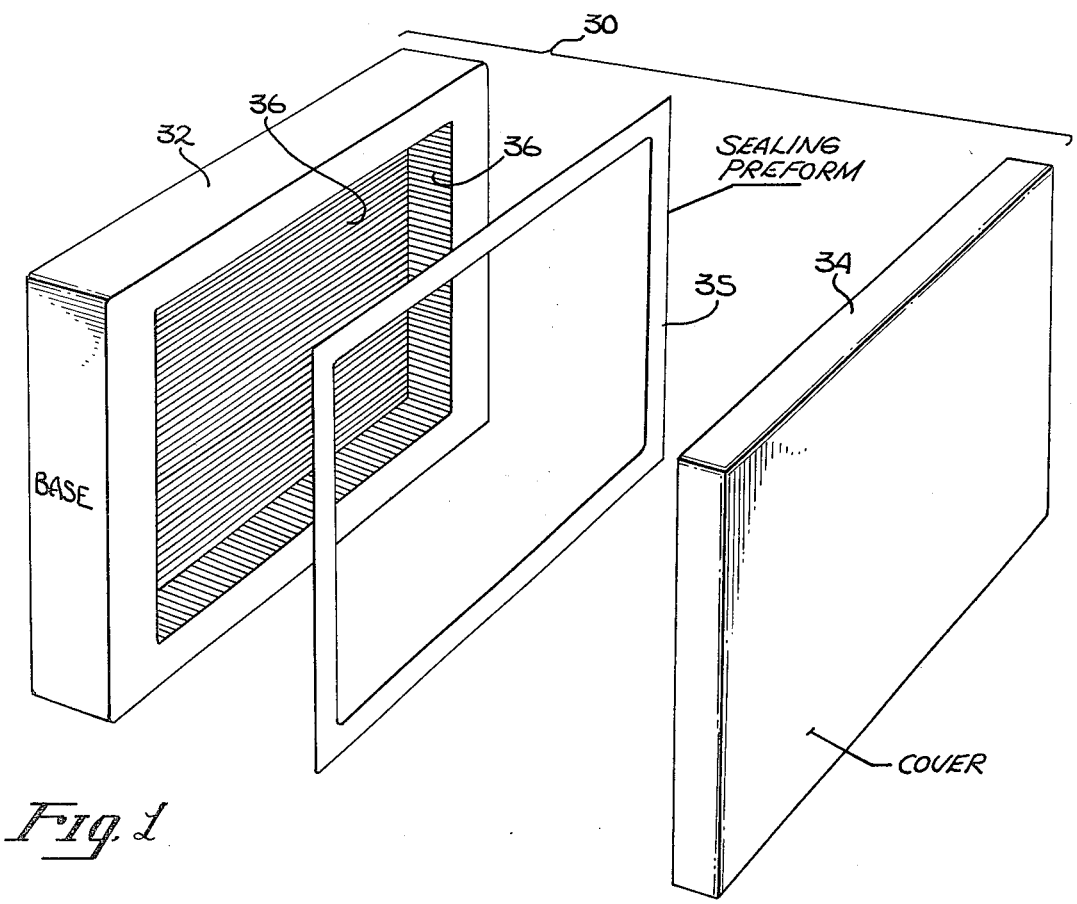
FIG. 1 is an exploded perspective view of a semiconductor heat pipe showing the base, cover and grooves formed in the interior surface of the closed container formed by the base and cover.
Figure 2:
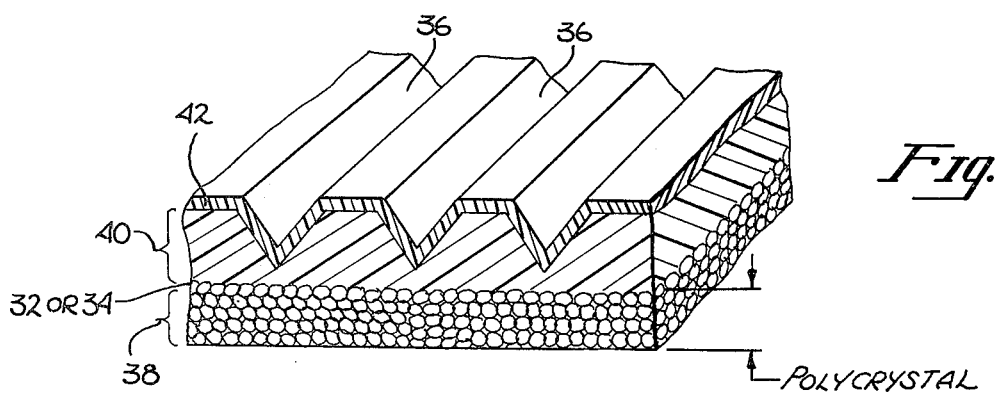
FIG. 2 is a magnified perspective cross-section of the interior surface of the closed container showing the grooves etched in a monocrystalline region and having a film layer disposed thereon.

Consider first the elimination of excessive accumulation of heat in high density massed integrated circuits. FIG. 1 illustrates a semiconductor heat pipe 30 according to the present invention. Base 32 is fabricated of a semiconductor material as is cover 34. Either a conventional sealing preform 35 or preformless diffusion bonding is used to insure a hermetic seal between base 32 and cover 34. When assembled, cover 34 and base 32 form a closed container having an interior surface upon which a plurality of grooves 36 are defined. The arrangement of grooves shown in FIG. 1 is purely for the purpose of illustration and any other orientation or organization of the grooves may be assumed according to the teaching of the present invention and of the art generally. At least those portions of base 32 and cover 34 which have grooves 36 defined therein are comprised of monocrystalline semiconductor material so that the preferential etching or removal characteristics of monocrystalline material may be exploited to form the plurality of microgrooves 36. Selected crystal orientation and etching or removal process characteristics lead to grooves of the desired depth and cross sections of either generally "V" shape (as shown in FIG. 2) or generally rectangular shape. Grooves may be etched to a depth, somewhat beyond the monocrystalline region as a means of blunting sharply angular cross-sectional geometries and reducing stress concentration factors. For simplicity, none of the figures indicate fill-ports which allow for the admission of working fluid into the heat pipe chamber.

FIG. 2 illustrates in magnified form one portion of grooves 36 in either base 32 or cover 34. In FIG. 2, base 32 and cover 34 are shown as having a first portion 38 comprised of polycrystalline material while the remaining portion 40 is monocrystalline material. Monocrystalline layer 40 may be formed upon polycrystalline layer 38 by any means well-known to the art, such as epitaxial growth, or other means of deposition coupled with laser or electron beam annealing. Generally, monocrystalline layer 40 will be only thick enough to contain grooves but can in certain instances involve the entire material thickness thus eliminating the polycrystalline region 38. In the embodiment illustrated in FIG. 2, grooves 36 are also shown as being covered by a film 42. Film 42 may be necessary in certain applications in order to provide grooves 36 with the proper physical characteristics which are required in order for the working fluid to wet the surfaces of grooves 36 and to obtain proper capillary action therein or to reduce stress concentration factors. The properties of certain materials to increase wetting and capillary action are well-known to the art and any conventional film may be used according to the application at hand. Such film application techniques include chemical transformations of the structural material itself as in the oxidation of silicon.

Figure 3:
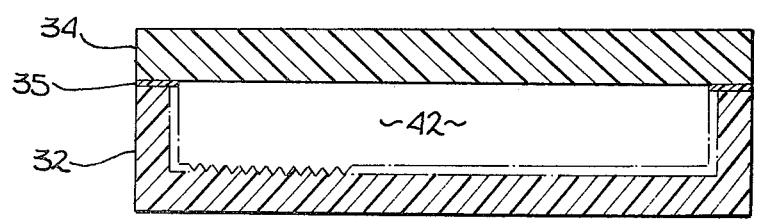
FIG. 3 is a cross-section of the assembled closed container of FIG. 1.

FIG. 3 illustrates an assembled semiconductor heat pipe of the type shown in FIG. 1. Here cover 34 is hermetically sealed to base 32 by means of preform 35 forming the interior closed cavity 42 in which the fluid is disposed.

Figure 4:
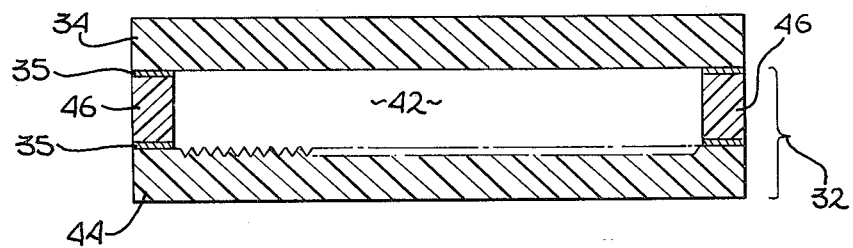
FIG. 4 is a cross-section of another embodiment of the closed container of FIG. 1.

FIG. 4 shows an additional embodiment of the semiconductor heat pipe of the type shown in FIG. 1 wherein base 32 is comprised of two separate members, namely a base plate 44 and a separate ring or frame 46 which provides the peripheral lip to base 32. In this case, two preform sealing layers 35 are employed to hermetically seal cover 34 to frame 46 and base layer 44 to frame 46.

Figure 5:
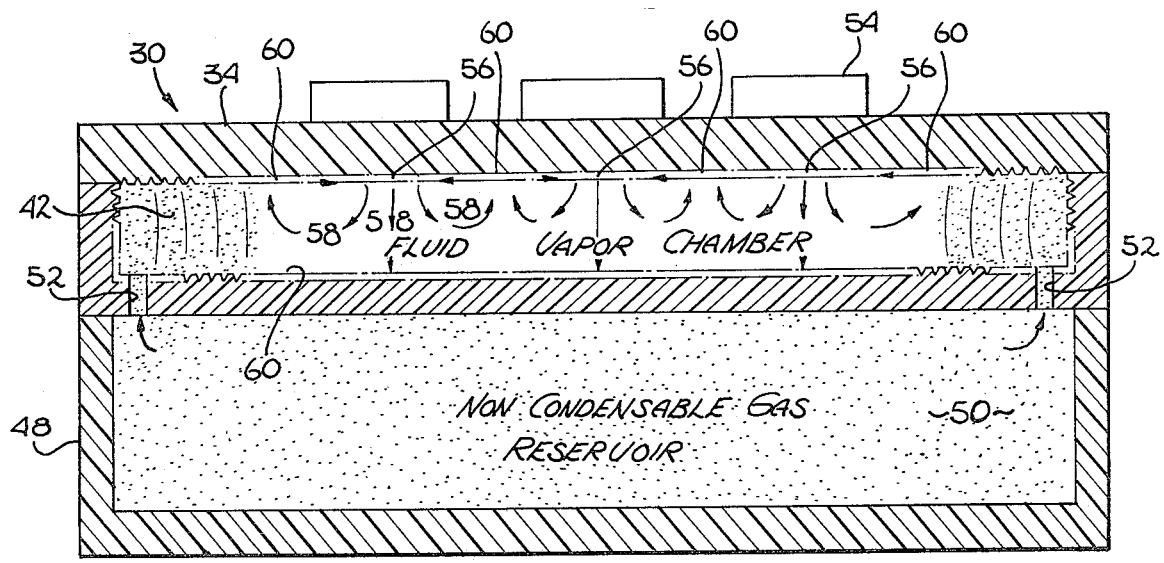
FIG. 5 shows a closed container coupled to a reservoir filled with non-condensable gas in communication with the fluid vapor chamber of the closed container.

FIG. 5 shows another embodiment of the present invention wherein semiconductor heat pipe 30 of the type shown in FIG. 1 is combined with a gas reservoir 48 having an interior chamber 50 filled with a non-condensable gas. Chamber 50 communicates with chamber 42 of heat pipe 30 by means of a plurality of ports 52. The combination of gas reservoir 50 with heat pipe 30 tends to produce a useful constant temperature region of varying size in cavity 42 independent of the amount of thermal load introduced into heat pipe 30. As additional thermal energy is dumped by power dissipators or circuits 54, which are illustratively shown as disposed upon the outside surface of cover 34, the volume of vaporized fluid within chamber 42 expands. Vaporized fluid leaves the heated portions 56 of cover 34 as shown by arrows 58, thereby increasing the volume which such vaporized fluid occupies. As the volume of vaporized fluid increases within chamber 42, noncondensable gas from reservoir 50 is forced from chamber 42 back into chamber 50. Therefore, the pressure within reservoir 50 rises as the volume decreases. Thus, the temperature of cavity 42 remains substantially constant due to the increased area available for working fluid to condense on the internal surface. Vaporized fluid condenses to liquid at cooler chamber locations 60 in 42 thus giving up its large latent heat and re-entering the wick structure for yet another circuit.

Figure 6:
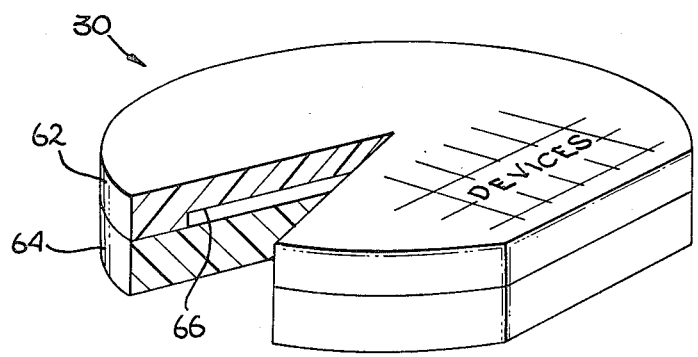
FIG. 6 is a cutaway perspective view of a semiconductor wafer structure showing the adaptation of the closed container of FIG. 1 to conventional semiconductor wafers having integrated circuit devices formed in at least one surface of the wafer.

FIG. 6 illustrates yet another embodiment of semiconductor heat pipe 30 formed of two full-sized conventional semiconductor wafers 62 and 64. Wafer 62 has an interior portion removed to form chamber 66. As in the case of the heat pipe of FIG. 1, heat pipe 30 of FIG. 6 includes a plurality of grooves formed within the surface of chamber 66 and the insertion of a heat transferring fluid. In the figure massed integrated circuit devices are directly formed within the upper surface of wafer 62 by conventional means. Although the embodiment of FIG. 6 shows the devices in the upper surface of wafer 62, it is entirely within the scope of the present invention that the devices may be located on or in convenient surfaces of either wafer 62 or 64. Furthermore, certain steps in device fabrication may take place after semiconductor heat pipe 30 is operational thus taking advantage of the stability of positioning due to the lack of fabrication process generated thermal gradients, i.e., this would allow for registration improvements during e-beam and implantation processing.

Figure 7:
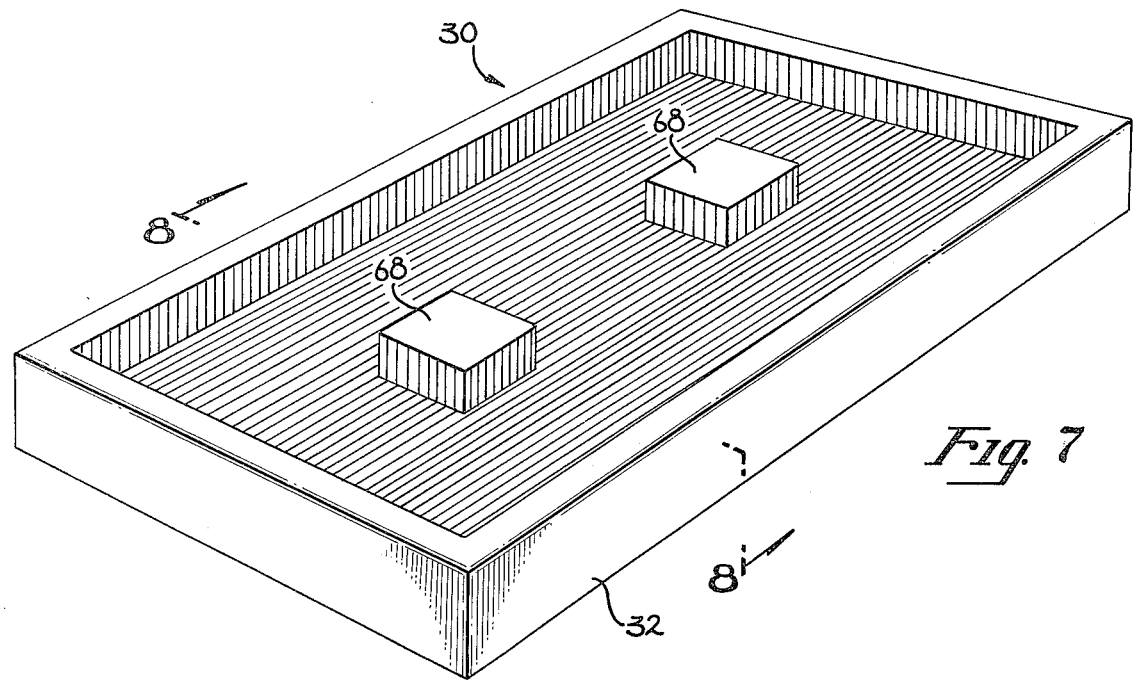
FIG. 7 is a perspective of the base portion of a closed container of the type shown in FIG. 1 wherein the base portion has one or more support bosses to provide structural support for the cover (not shown).
Figure 8:
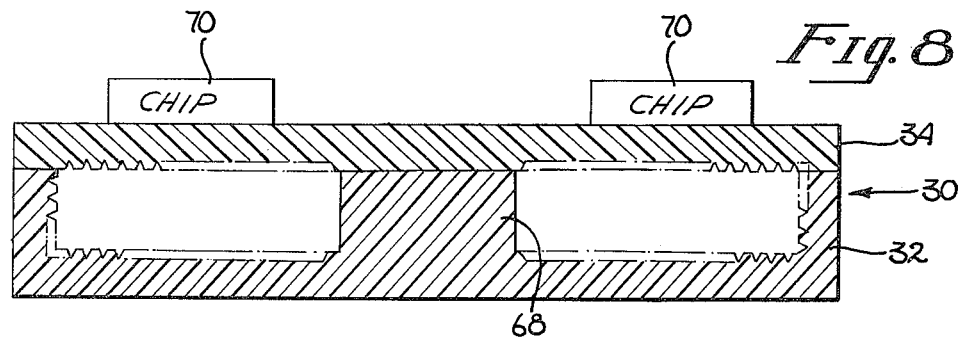
FIG. 8 is a cross-section of the assembled cover and base of a semiconductor heat pipe of the type shown in FIG. 7 showing two power dissipating electronic devices (chips) disposed on the external cover surface.

In such large-scale, high density integrated circuit masses as shown in FIG. 6, it is contemplated that chamber 66 will require internal structural support in many cases in order to be practical. FIG. 7 illustrates a rectangular semiconductor heat pipe 30 wherein base 32 is provided with support bosses 68 in order to give structural rigidity to the overlying cover. FIG. 8 illustrates a cross-sectional view of semiconductor heat pipe 30 of FIG. 7 wherein boss 68 is integrally formed with the base 32. In such cases, it is contemplated that power dissipators or integrated circuit chips 70, which are disposed on or defined within cover 34, will be positioned so as to not overlie boss 68. While, for the sake of simplicity, FIG. 8 shows only two power dissipators disposed on or within cover 34, it is of course within the scope of this invention that cover 34 will contain substantially many more such dissipators. It is within the expectation of the present invention that at least 30 to 100 such integrated circuits could be disposed on or within cover 34 on a single semiconductor heat pipe 30, with the determination being affected by individual device size, power dissipations, and necessary communication means. As device sizes diminish this number climbs toward 1000 and more.

Figure 9:
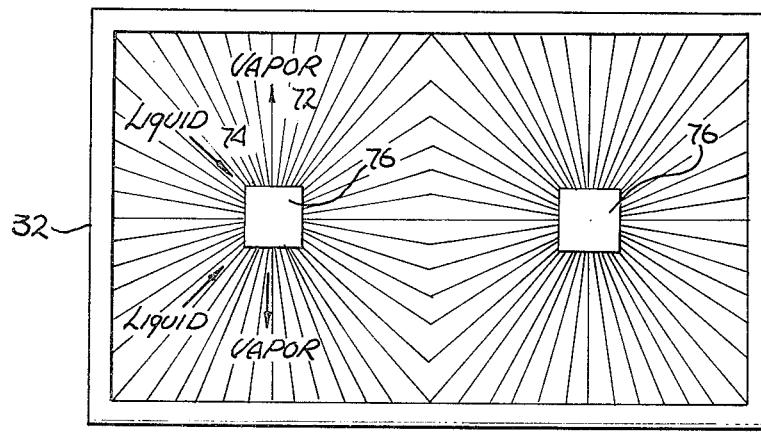
FIG. 9 is a simplified plan view of another embodiment of a semiconductor heat pipe of the type shown in FIGS. 1 or 7 wherein the base and/or cover grooves are arranged and configured to optimize heat conduction from two localized sites.

Although the embodiments of the present invention which have been shown diagrammatically in FIGS. 1 through 8 have illustrated a generally parallel arrangement of grooves within the interior chamber of semiconductor heat pipe 30, any other orientation or arrangement could be employed as dictated by performance requirements and thermal loading geometry. For example, in FIG. 9, a base 32 is shown in the top plan view without a cover 34 wherein grooves 36 converge to two localized positions. In this manner, typical directions of vapor travel shown by arrows 72 and typical directions of liquid travel shown by arrows 74 are centralized at selected locations 76 at, near, or opposite to which the high power dissipator or circuit will be placed. Any other groove configuration can be applied, such as spirals, circles, and free-form curvilinear configurations. Furthermore, it is fully in the scope of the present invention to include various intersecting arrays of grooves, discontinous grooves, and even disconnected arrays of pits formed in a similar manner.

B. SEMICONDUCTOR HEAT PIPE CARRYING APPARATUS AND COLD PLATES

Just as in conventional semiconductor packaging, e.g., DIP packaging, where packages are massed on a circuit board to achieve the required circuit densities, it is contemplated that the mass circuit density achieved by the present invention can be expanded by at least an order of magnitude by combining a multiple number of semiconductor heat pipes on a carrying apparatus as disclosed below.

It is entirely within the scope of the present invention that heat from a plurality of semiconductor heat pipes, when massed, can be removed by a number of alternative means. For example, a single, larger heat pipe can be brought into thermal contact with a plurality of smaller semiconductor heat pipes of the type illustrated in FIGS. 1-9. A conventional heat exchanger can be employed using a flowing coolant gas or liquid to provide a cool external surface to which a multiple number of selected heat pipes may be thermally coupled. A thermoelectric plate can be mantained at a fixed temperature by conventional means and a mass of semiconductor heat pipes thermally coupled to the cooling surface. A large mass of highly, thermally conductive material, which in itself may be cooled by conventional convection, conduction or radiation mechanisms, can be thermally coupled to a massed number of semiconductor heat pipes. Additionally, an apparatus can be employed such that the semiconductor heat pipes are arranged to permit a cooling fluid to flow directly around the exterior surfaces of each heat pipe 30, in which case the carrying apparatus serves only to position the individual heat pipes in such a manner as to provide minimum resistance to and maximum exposure of each heat pipe to the cooling fluid and to locate interfacing communication lines.

FIG. 10 illustrates one embodiment of a carrying apparatus 84 having disposed on its surface a multiplicity of semiconductor heat pipes 30, some of which are shown with the covers, (94 of FIG. 11b), removed to diagrammatically illustrate the semiconductor chips 86 disposed thereon or therein. The carrying apparatus 84 may be comprised of semiconductor material having a matching thermal coefficient of expansion or may employ conventional metallic or dielectric materials with suitable expansion coefficients. In the carrying apparatus of FIG. 10, apparatus 84 includes a plurality of internal, longitudinal chambers 88 through which a cooling fluid or gas is circulated by conventional means. Each of the covered semiconductor heat pipes 30 is disposed on a convenient surface of apparatus 84 and therefore is maintained at substantially the same temperature as carrying apparatus 84, which in turn is isothermally maintained by the flow of coolant through chambers 88. Apparatus 84 may also simply be a portion of a large carrying heat pipe to which the much smaller heat pipe packages 30 are attached. This large carrying heat pipe has its own internal working fluid and merely provides thermal, mechanical and communication interfaces for numerous heat pipes 30.

FIG. 11a illustrates another embodiment whereby a plurality of semiconductor heat pipes 30 may be massed and isothermally maintained. A central conduit 90 forms the mechanical and thermal backbone of a tree-like carrying structure 84 having perpendicularly extending members 92 on both sides of conduit 90. Members 92 may be solid and highly thermally conductive or may be hollowed extensions of conduit 90. Either forced conventional cooling or heat pipe technology may be utilized to fabricate the branched thermal control apparatus 84. Members 92 on the left portion of FIG. 11a are shown with semiconductor heat pipes 30 removed while members 92 are shown on the right portion of FIG. 11a with heat pipes 30 inserted. FIG. 11b shows a cross-section of a single covered semiconductor heat pipe 30 of the type which may be used in the embodiment of FIGS. 11a and 10. Base 32 is combined with cover 34 to form the semiconductor heat pipe in the manner as described in connection with FIGS. 1-9. In order to avoid electrical and physical damage or interference with semiconductor integrated circuits disposed on or in cover 34, an additional semiconductor cover 94 is provided above cover 34 and hermetically sealed thereto. Of course, it is entirely within the scope of the present invention that any chamber formed between covers 94 and 34 may also have a wettable layer disposed over the interior surface and a heat-transferring fluid inserted in the chamber to form a double chambered heat pipe. However, for sake of clarity, no such additional heat pipe structure is shown in the illustrated embodiments and it is expected that only the most rare applications will require this additional complexity. When cover 94 forms a new chamber structural supports to prevent the cover 94 from flexing and damaging the contained circuitry 86 would be present to act as spacers between cover 94 and cover 34 and could easily be integral to cover 94.

FIG. 12a shows another carrying apparatus of the present invention in combination with a semiconductor heat pipe of the type described in connection with FIG. 6. The semiconductor heat pipe wafers 30 are stacked between alternating and generally similarly shaped highly thermally conductive discs or plates 96. These plates are of highly thermally conducting material. In the embodiment of FIG. 12a, each plate 96 is provided with a plurality of thin fins 98 to facilitate cooling either by natural or forced convection of gaseous coolant or by thermal coupling with a cooling fluid which flows along the exterior surface of carrying apparatus 84 of FIG. 12a. The flattened portion 100 of apparatus 84 is not provided with this plurality of fins 98 and can be employed as the electrical connection surface to the mass density of circuits contained within semiconductor heat pipes 30.

FIG. 12b is a cross-sectional view of a portion of carrying apparatus of FIG. 12a. Again, the option of either incorporating the electronic devices directly in the heat pipe material or mounting them discretely and using an additional cover 94 is available, the latter being shown. As in FIG. 11b, semiconductor heat pipe 30 in FIG. 12b is comprised of a base 32, cover 34 and an additional cover 94. Base 32 and cover 94 are thermally coupled to adjacent discs 96.

FIG. 13 illustrates yet another embodiment of carrying apparatus 84 wherein semiconductor heat pipes 30, having the additional cover 94, are stacked vertically such that base 32 of one heat pipe 30 is in thermal contact with cover 94 of the adjacent heat pipe 30. However, in the embodiment of FIG. 13, a plurality of grooves 102 are longitudinally defined along the lower surface of base 32 of each heat pipe 30. Grooves 102 may be formed by preferential etching or removal of selected portions of base 32 in substantially the same manner as grooves 36 are formed within chamber 42 of heat pipe 30. Coolant is forced through grooves 102 and isothermally maintained in a conventional manner.

In the case of integrated devices 86 being directly integrated in semiconductor heat pipe 30, cover 94 can be replaced by a protective thin film deposited directly on the surface containing the devices.

Figure 14A:
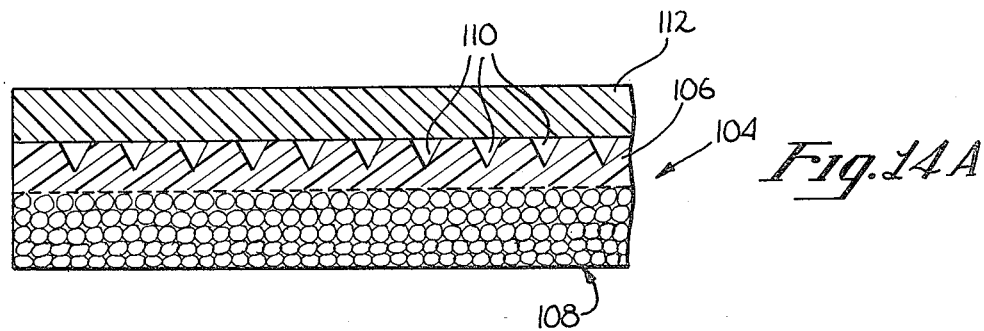
FIG. 14a illustrates a cross-section of the temperature-controlled plate showing the plurality of fluid or gas carrying grooves closed by the juxtaposed top layer.

The embodiment of FIG. 13 may be particularly adapted as shown in FIG. 14a to provide a cold plate or constant temperature surface. Substrate 104 has an upper portion 106 which is monocrystalline. The lower portion 108 of substrate 104 may be polycrystalline if desired with the monocrystalline layer 106 created by deposition or processing previously discussed. A plurality of grooves 110 are then formed within monocrystalline layer 106 of substrate 104 by preferential etching or removal of the monocrystalline substance. A thin cover 112 is then disposed over layer 106 to substantially close each of the grooves 110. A coolant is then forced through grooves 110 and isothermally maintained by conventional means. Cover or plate 112 is thus isothermally maintained by the coolant flowing through grooves 110, providing a cold plate or constant temperature surface which may be used in special applications not requiring a heat pipe. For example, it is expected that one of the uses of the apparatus of FIG. 14a as well as of many of the other apparatus described in this application is in the field of photovoltaic converters. In one such application, layer 112 of FIG. 14a would contain photovoltaic converters. The isothermal characteristic of layer 112 will then be exploited to obtain the maximum theoretical efficiencies and lifetimes from the photovoltaic devices.

Of great interest is the expected application of the previously described inventions to not only control photovoltaic cell temperatures but to also store heat removed from such cells for useful applications involving the performance of work or associated thermal control. FIG. 14b is a plan view of grooves in an uncovered cold plate of the type in FIG. 14a. The constrictions in groove cross-section 78 provide a localized cooling action due to the adiabatic nozzle effect. Pumped coolant 80 would supply an additional refrigeration at these points. These nozzle locations might correspond to areas where highly power dissipating power transistors or solid state lasers reside.

C. EXTERNAL INTERFACING WITH MASSED INTEGRATED CIRCUIT DEVICES

Clearly, the carrying apparatus and semiconductor heat pipes described in connection with FIGS. 1–13 have the capacity for including hundreds or thousands of integrated circuits in a single package similar in size to conventional dual-in-line (DIP) packages and chip carriers. Pin size and spacing limitations are substantial and crucial limiting factors with prior art packaging and, clearly, conventional metallic input-output pin assemblies are unusable with the present invention. FIGS. 15–28 illustrate a means included in the present invention by which interconnection and interfacing large numbers of integrated circuits in a high density manner can be practically achieved.

Figure 15:
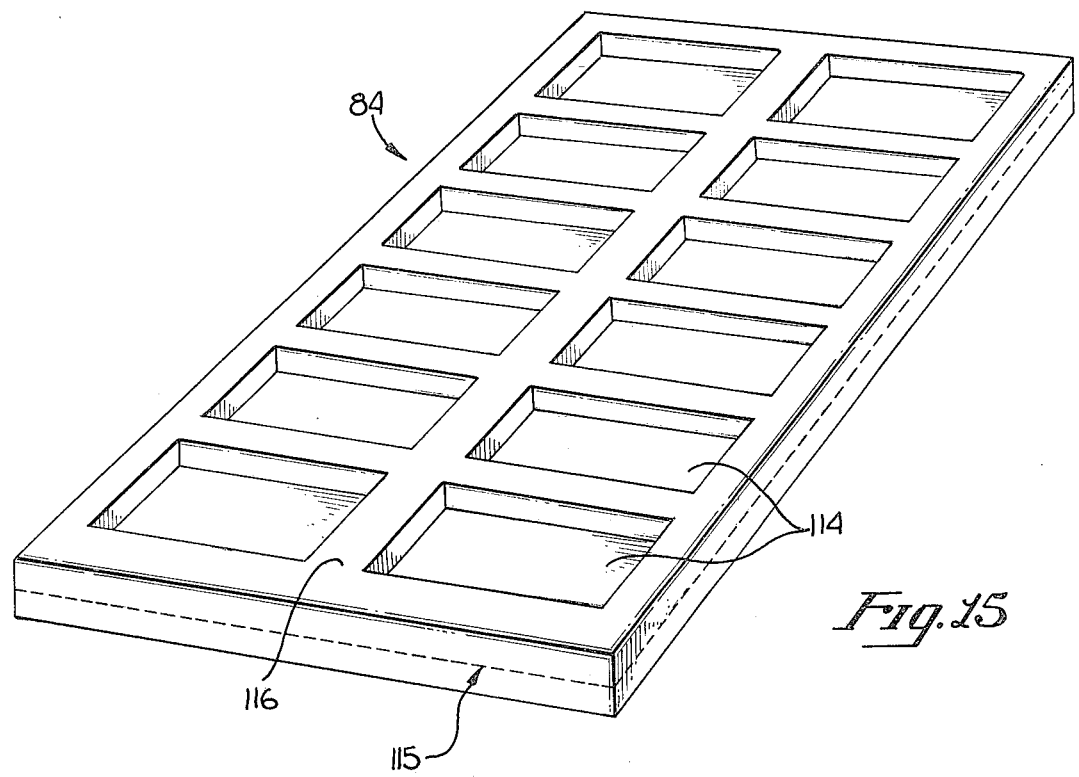
FIG. 15 illustrates the packaging of the present invention wherein a plurality of cavities are formed in a base for the disposition of a corresponding plurality of integrated circuit devices or chips.
Figure 16:
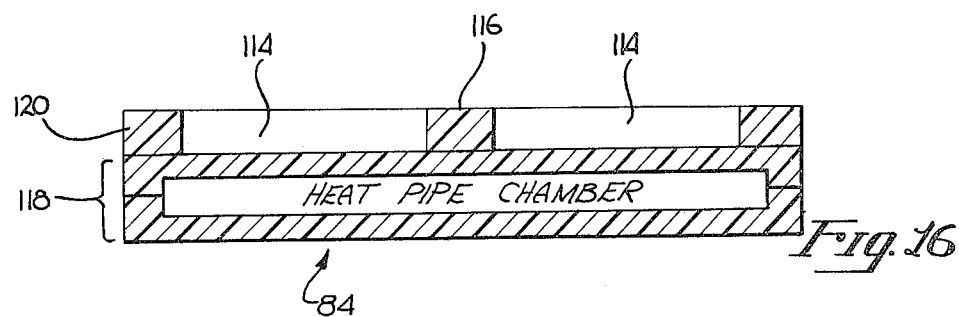
FIG. 16 is a cross-section of FIG. 15 showing in alternative form the sngle or double layer construction of the cavitied base of FIG. 15 and incorporation of an integral semiconductor heat pipe.

For the sake of clarity and simplicity, the heat pipe of FIG. 1 will be assumed, although the teachings and principles of the present invention may be applied to any of the heat pipes which have been illustrated above or which are included within the scope of the claims. Heat pipe 84 of FIG. 15 is rectangular and has a plurality of cavities 114 formed in one external surface. In the illustrated embodiment, cavities 114 are aligned in a double row with a central island or rib 116 extending longitudinally along the rectangular substrate. Heat pipe 84 may consist of one or two layers, as convenient, either having a single heat pipe base with a second reticulated frame disposed thereon forming cavities 114 or no additional frame with cavities formed directly in the heat pipe surface. This option is indicated by the dotted line 115. FIG. 16 shows a cross-section of heat pipe 84 of FIG. 15 wherein the former structure utilizing a heat pipe base 118 and a separate cavity frame 120 is indicated. Base 118 is assumed to be the type of heat pipe as described in FIG. 1. The heat pipe base will be referred to as the base for simplicity.

Figure 17A:
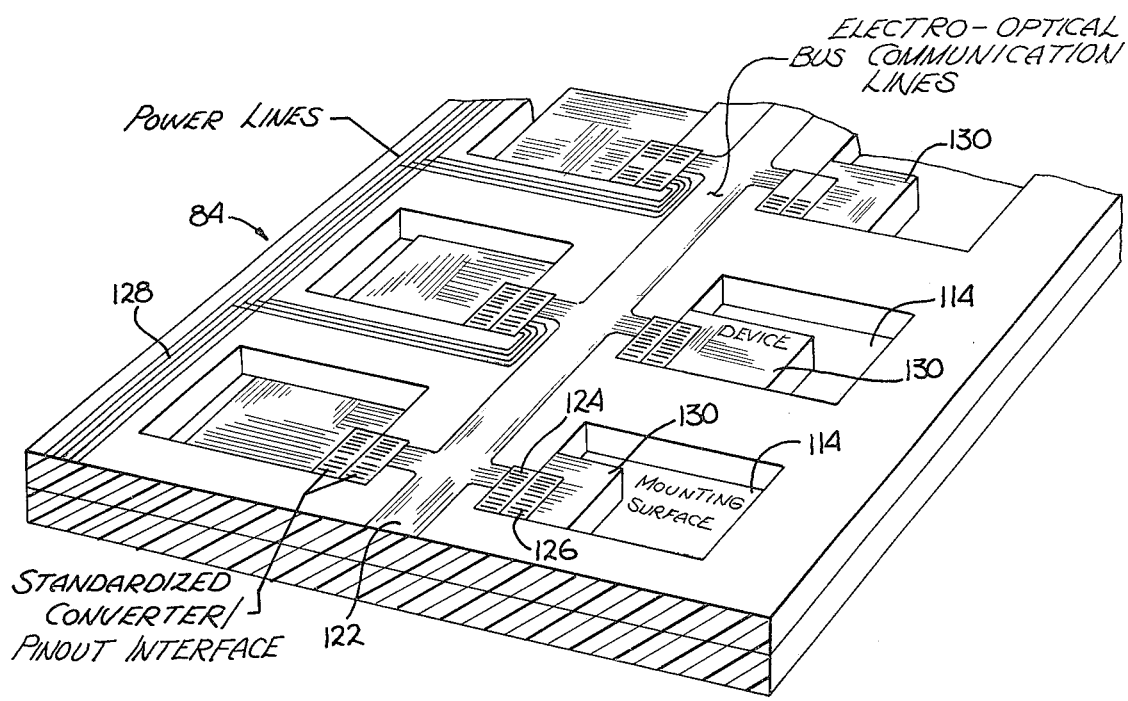
FIG. 17a is a perspective view of the base shown in FIG. 15 illustrating the position of the communication means within the base, the mating and signal coversion means at the edge of each cavity and the integrated circuit device or die within each cavity.

FIG. 17a illustrates the heat pipe 84 of FIG. 15 wherein a plurality of semiconductor devices 130 have been disposed within cavities 114. Central rib 116 provides or supports electrical and/or optical communication lines 122 which allow for required communication to, from, and between the integrated circuit devices mounted on semiconductor heat pipe 30 in each cavity 114. In many applications these communication lines would be arranged in bus structure to minimize congestion and would normally consist of electrical, optical or both types of signal carrying pathways. Bus 122 interfaces with standardized electro-optical base converters 124 which have a series of chip input and output terminals in a standardized configuration. These rib-mounted converters mate with the standardized device pin-outs 126 located in the same corner of all devices thus standardized. Connection is made to pin-out 126 by means such as masked deposition, beam welding techniques, flow soldering, or numerous other conventional approaches appropriately miniaturized. In addition, other surfaces of heat pipe 84 may be provided with additional electrical or optical lines. For example, in FIG. 17a the left side 128 of the heat pipe/package has been provided with conventionally fabricated electrically conductive power lines which are coupled through converters 124 to each integrated circuit 130. Similar power lines may be disposed on the right edge, but have been omitted for the sake of simplicity. Doping of the heat pipe structural material or deposition of conductive material upon it would be two of many approaches to providing electrical lines using conventional technology.

Although FIG. 17a indicates individual integrated circuit devices 130 mounted in compartments 114 it is entirely within the scope of the present invention to include configurations wherein devices 130 are replaced by individual heat pipe/packages of the types previously discussed (i.e., FIGS. 1-14) still utilizing heat pipe 84 but increasing its size accordingly. Also, configurations wherein individual integrated circuits are themselves conditioned using the disclosed groove methods in order to supply device surfaces which act as operative heat pipe surfaces are within the present scope.

FIG. 17b illustrates in cross-sectional detail a simplified view taken through heat pipe 84 of FIG. 17a. In one embodiment, central rib 116 has defined therein a plurality of grooves 132 in which one or more conventional optical fibers have been placed. On or in the islands 134 which are formed between each of the grooves 132, electrical communication lines have been disposed by conventional means to provide the composite electro-optical bus 122. Although only a few electrical and optical lines are shown in FIG. 17b, it is of course contemplated that the number of such lines may be very large, particularly in view of the very small diameters in which optical fibers are readily available and the ease to which very fine electrical lines may be formed by standard photolithographic techniques.

Figure 18:
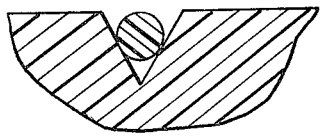
Figure 19:
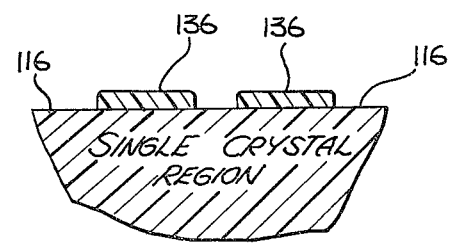
FIG. 19 illustrates another embodiment of an optical conductor as part of the communication means using disposed or grown thin film materials.

The optical communication line as shown in FIGS. 18 and 17b comprises a generally V or rectangular shaped groove in which a discrete optical fiber has been laid or formed in place. Alternatively, the embodiment of FIG. 19 uses the deposition of a substance 136 which is optically transmissive in its deposited final state. Within the scope of this figure are techniques such as electron or laser beam processing of thin films to render them either transmissive or non-transmissive. Only the optically transmissive portions are depicted according to FIG. 19.

Figure 20:
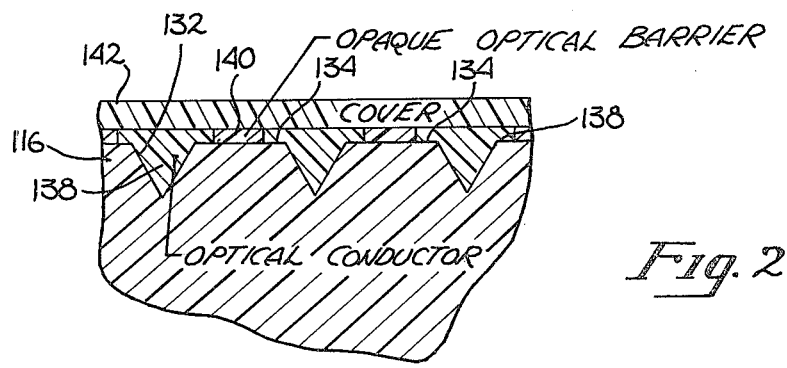
FIG. 20 illustrates yet another embodiment of the optical conductors within the communication means wherein optically conductive material is defined between an optically opaque cover and opaque groove barriers.

Yet another embodiment is illustrated in FIG. 20 wherein molded-in-place optical conductors are formed by defining the same grooves 132 in rib 116 followed by the deposition within the grooves of an optically transmissive material or conductor 138. Each of the optical conductors 138 is separated by an opaque optical barrier 140. This barrier can easily be supplied by forming an opaque coating on either the islands 134 or the cover 142 underside. Optical barriers 140 may be formed of any substance well-known to the art, including conductive metallic substances, whereby optical barriers 140 may also double as the combined electrical communication lines within electro-optical bus 122. In the embodiment of FIG. 20, optical conductors 138 are sealed by means of an opaque cover or layer 142, formed by conventional deposition processes or physical placement on conductors 138 and, if necessary, by barriers 140.

One additional approach for formation of optically conductive lines included in the present invention is to employ empty grooves which act as hollow reflector tubes. Appropriate reflective coatings deposited on the groove walls optimize the transmission characteristics.

Figure 21:
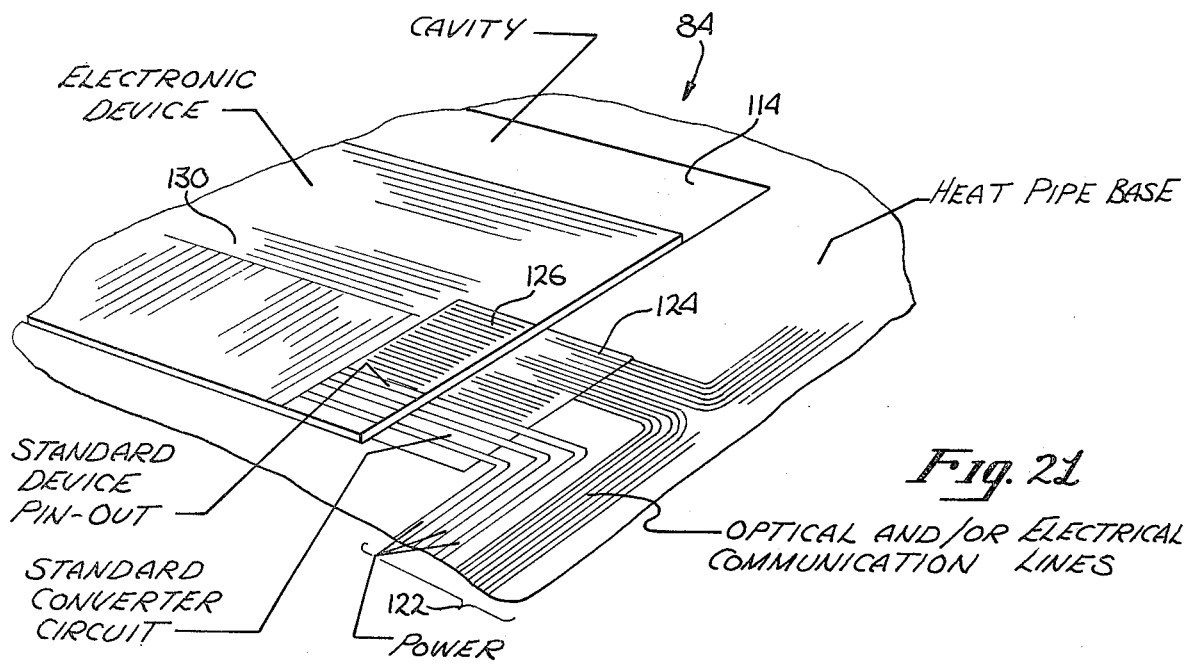
FIG. 21 details the inerface between a standardized device or die pinout configuration and a standardized converter circuit which is coupled to the optical and electrical communication lines of the base.

FIG. 21 illustrates a plan perspective view of the standardized coupling between chip 130 and electro-optical communication bus 122. Both electrical and optical communication lines disposed on or in rib 116 terminate in a standardized converter circuit 124, whose fabrication utilizes some combination of semiconductor, optoelectronic, solid state laser or other technologies known to the art, which converts optical and electrical signals to a form most convenient for the disposed devices 130 of FIG. 21 (e.g., optical signals to digital electronic signals) or for the bus 122 and which may provide appropriate buffering or latching and power to a standard pin-out pad 126. It is contemplated, as part of the present invention, that a standardized protocol would be employed regardless of the nature of the electronic circuits contained within chip 130. Converter circuit 124 is either formed in place within the monocrystalline semiconductor upper layer of rib 116 or is discretely placed in the cavity wall as a separately fabricated device. Therefore, it is expected that a standardized pin-out arrangement will be required on each chip 130 regardless of the nature of the circuit on chip 130, in order that alignment and mating may be reliably and practically achieved. The packaging operation becomes no more than the placement of each device 130 in its cavity 114 locating each on the same two edges. Conventional methods of attaching devices 130 to their respective prepared cavity surfaces 114 can be employed. Connection between the standard device pin-out 126 and the standard converter circuit 124 can be achieved using techniques such as laser or electron beam welding, deposition, wave soldering, mechanical clamping, resistance welding, etc. The fact that these bonding operations can all take place simultaneously is a great manufacturing advantage.

Figure 22:
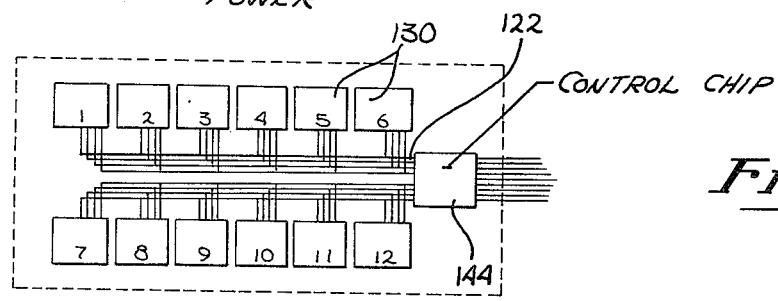
FIG. 22 illustrates in plan, a diagrammatic view of the package of FIG. 17a wherein each of the disposed circuits is coupled to an electrical communication bus which in turn is controlled by a package chip which may be disposed in the surface of the monocrystalline semiconductor package.

To insure that intercommunication and interfacing take place efficiently and reliably a package control chip is included as a further embodiment of the present invention. FIG. 22 is a plan view of a control chip 144 supervising a purely electronic on-board communication bus. Control chip 144 of FIG. 22 receives a combination of electronic and optical signals from an external source and converts them to electronic signals of the proper characteristics and sequencing for on-board use. Each device 130 placed in cavity 114 of FIG. 22 therefor receives only electronic signals which pass through a non-converting section of that cavity's respective standardized converter circuit 124. Thus FIG. 22 is a package wherein all on-board package communication after the control chip is done electronically without optics.

Figure 23:
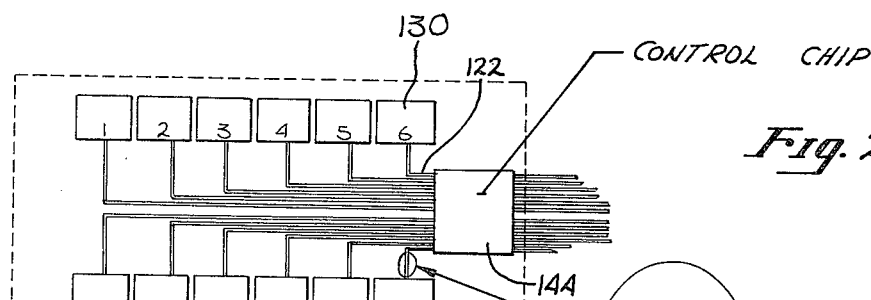
FIG. 23 is another embodiment of the packaging of FIG. 17a wherein the individual disposed circuits are coupled to a package control chip by a discrete plurality of optical communication lines.

FIG. 23 is the other extreme wherein all on-board package communication is achieved optically in a non-bus approach. This package control chip 144 receives a combination of electronic and optical signals from an external source and converts them to optical signals of the proper characteristics and sequencing. Each device 130 placed in cavity 114 of FIG. 23 therefore receives only optical signals which must pass through a converting section of that cavity's respective standardized converter circuit 124. Thus FIG. 23 is a package wherein all on-board package communication after the control chip is done optically.

Depending on desired performance, cost and reliability a combination of the methods depicted by FIGS. 22 and 23 will be utilized. Control chip 144, in its simplest form, will merely interface the user with a package structure of the type shown in FIG. 22 or 23. In more complex cases control chip 144 will control both types of systems, FIGS. 22 and 23, in the same package shown in FIG. 17b.

In view of the microcomputer capabilities which are becoming available it is seen as a logical embodiment of the present invention to assign a monitoring capability to control chip 144. Such package parameters as temperature, pressure, vibration, moisture content, electrical quantities, optical quantities and even error detection can be incorporated. Thus in its spare time control chip 144 will insure correct operating conditions and with what capability remains, take corrective actions or sound alerts in case of problems. Appropriate sensors for these applications are presently part of technological knowledge and ability.

The heat pipe package 84 or base of FIG. 15, will, in general, be covered in order to protect the packaged devices in a hermetically sealed environment and provide additional mechanical rigidity. Therefore, a cover 146 is provided for heat pipe package 84. Shown in simplified cross-section in FIG. 24, package 84 is illustrated as having an electro-optical line 148 extending to an edge 150. For the sake of simplicity, it should be assumed that line 148 is an electrical line. Similarly, cover 146 has a beveled edge 152 upon which a similar electrical line 154 has been disposed. Line 154 is similarly led to the edge of bevel 152 and electrical contact is made along interface 156 where lines 154 and 148 are adjacent. Joining of lines 154 and 148 can be achieved by conventional electron or laser welding, soldering, acoustic welding, diffusion bonding, mechanical clamping or any other technique well-known to the art. In this manner, cover 146 may similarly be made of or have at least on its lower surface a monocrystalline semiconductor region in which additional integrated circuit devices may be formed. Electrical connections of the type in FIG. 24 provide a means by which electrical lines forming part of communication bus 122 may be coupled to electrical lines disposed on cover 146. It is also within the scope of the present invention that additional electrical lines may be segregated and extended to an edge of cover 146 in the same manner as is electro-communication bus 122 on the cavitied surface of base 84, thereby providing separate and analogous buses and circuitry in both base 84 and cover 146, although it is contemplated that the chief advantage of the present invention will be the ease of implementing and addressing large numbers of microelectronic circuits of a type complementary to those deposited in base cavities 114 in an area which would otherwise not be utilized (i.e., the cover inside surface). As an example large quantities of memory circuits could easily be provided in cover 146 for users to utilize to any desired degree.

FIGS. 25–28 show in greater detail the edge connection between electro-optical communication bus 122 and an external electro-optical ribbon 156. At the edge of package base 84, a portion of cover 146 is removed to allow the insertion of a mating plug 158. In the embodiment of FIG. 25, three electrical lines 162 are shown as disposed on rib 116 and brought to the edge of base 84 for conventional coupling to matching electrical conductors within ribbon 156 (not shown). An insulating layer 160 may then be disposed over electrical lines 162 and may serve as a base for optical lines 164. Alternatively, the groove and island combination as illustrated and described in connection with FIGS. 17b–20, may also be employed. For the sake of simplicity, the embodiment of FIG. 25 is shown as an overlying single layer of aligned optical lines 164 and underlying electrical lines 162. Ribbon 156 is fixed with respect to plug 158 by virtue of being embedded in a potting material 166. Plug 158 is then aligned to base 84 and cover 146 by means of a pair of guide rails 168 which consist of cylindrical segments disposed within photolithographically positioned and created V-grooves 170. Correspondingly, photographically created V-grooves 172 are formed within plug 158 to provide proper alignment between bundled ribbon 156 and optic bundle 164. V-grooves 170 and 172 may be formed in monocrystalline semiconductor base 84 and monocrystalline semiconductor plug 158 in substantially the same manner as V-grooves 132 in FIG. 17b.

Plug 158 is shown as assembled to base 84 and cover 146 in FIG. 26. Electro-optical ribbon 156 is then led to an exterior peripheral or user where the signals are utilized in the desired manner. Of course, within the near term technology, it is predictable that many semiconductor integrated circuits will be substantially optical in their nature of functioning and the electro-optical converters 124 which are shown in the packaging of the present invention will either be incorporated into semiconductor devices 130 or totally eliminated. In this developing technology, then, the packaging of the present invention will be perfectly suited and, by comparison, conventional prior art electronic packaging will be grossly inefficient and overly cumbersome.

Although the connection of plug 158 to cover 146 and base 84 is contemplated in FIG. 26 as being by means of conventional epoxies or adhesives, it is possible to provide a semi-permanent connection whereby the packaging of the present invention may be connected, removed and re-connected to ribbon 156. In the embodiment of FIG. 27, plug 158 is coupled to cover 146 and base 84 merely by means of cylindrical break-away pins 174. Holes 176 are provided between plug 158 and cover 146 where pins 174 will be inserted. A fracturable adhesive is placed within the hole and pin 174 fixed therein by the adhesive. Adhesive is not provided between plug 158 or cover 146 at any other locations.

FIG. 28 illustrates in detail a cross-sectional view of pin 174 within hole 176 defined between plug 158 and cover 146. Pin 174 is slightly undersized with respect to the minimum cross-sectional dimension of hole 176 and is bonded thereto by a layer of breakable adhesive 178. Pin 174 is provided at its head with a polygon shaped socket, for example a square, 180 in which a wrench or other suitable instrument may be placed to apply a torque to pin 174 when it is desired to break epoxy 178. In this manner, plug 158 may be connected, removed and reconnected to the packaging of the present invention by applying a tortional force to pins 174 and later re-wetting the surface of the pins with an appropriate, conventional break-away adhesive or epoxy when reconnection is to be made.

Although the present invention has been described and illustrated herein with respect to certain presently preferred embodiments, it is to be understood that many other alternative embodiments can be devised according to the teachings and spirit of the present invention.

The present invention is a novel and unique packaging employing existing semiconductor fabrication techniques and optical conductor technology to yield inexpensive and standardized semiconductor packages having heretofore unachievable circuit densities and thermal loading capacities.

In addition, by virtue of the integral isothermal operation of packaging according to the present invention, new applications directed towards applied solar cell technology and specialized research applications are evident.

The packaging of the present invention provides a substantial increase in the number of input-output pins which can be used for the communication or addressing of a multiplicity of chips within a single package. It is expected that within a one-inch by three-inch package, substantially in excess of 1,000 individual leads will be used in the input/output ribbons.

The ratio of the number of packaged electronic functions to the units of power consumed or to the units of volume used will greatly be increased by the present invention by introduction of the integral heat pipe technology and electrical/optical intercommunication.

A packager can achieve total standardization by employing the single identical standardized pin-out protocol for all devices and only activating that portion of the standardized converter pins which the device in question requires. The non-utilization of pins is no longer a crippling and unacceptable alternative in the packaging of the present invention.

The materials utilized in the fabrication of the present invention are abundant and therefore inexpensive. Little or no precious metals are necessary unlike conventional packaging. The purity and perfection of the materials utilized in the present invention are established facts since they are largely used in semiconductor fabrication today.

Expensive and labor intensive operations such as conventional wirebonding and die attach are totally automated and done in mass production fashion. Conventional wire bonding diagrams are totally eliminated. A long string of specialized packages for different pin counts is replaced by one, and the two basic limitations on packaging, namely pin limitations and thermal dissipation, are effectively eliminated.

Utilization of semiconductor packaging, as herein taught, affords the additional benefit that radioactive sources inherently included within conventional packaging material, which cause "soft errors", will be substantially eliminated due to the inherent lack of such radioactive sources in semiconductor material.

Furthermore, by use of this semiconductor packaging, near zero moisture residue will be included or admitted within the package cavities, during all steps of manufacture and during subsequent operating life. Encapsulating materials which may be necessary to rugidize semiconductor packaging, can, according to the present invention, be isolated from all sensitive circuit areas with the result of a dry, hermetically sealed package.

Furthermore, circuit packaging densities will be dramatically improved and thermal performance vastly improved over that known of all conventional chip carriers.

Many problems associated with the electro-magnetic interaction and fundamental limitations of highly dense arrays of metallic conductors, which are characteristic of prior art packaging, are substantially avoided by the use of noise-free optical communication and large line spacings for what electrical lines are needed. Furthermore, large electric field gradients, which are known in prior art packaging to be contributive factors to electromigration failures, are virtually eliminated by use of the optical-electrical bus in semiconductor packaging described herein.

By locating the chips on two edges within the cavities, as shown within FIGS. 17a et.seq., and by employing a standard bank of electro-optical converters, each device to be packaged can be placed in any location regardless of the number of pins which are actually used or operated or of the amount of power dissipated, which flexibility is totally unheard of in prior art, massed density circuit carriers.

Furthermore, the present invention lends itself to an on-board or intra-package microcomputer to monitor the various aspects of package integrity, which heretofore have gone virtually uncontrolled and undetected. These parameters include temperatures, pressure, humidities, heat pipe, wick wetness or liquid content, and electrical and optical tramsmissivity. Such on-board or intra-package microcomputers could also address aspects of encoding, fault diagnosis and package integrity with automatic unlatching of defective components and insertion of back-up, substitute units.

By virtue of the use of semiconductor material for packaging, as opposed to the vastly different dielectric and metal materials now used in packaging, the semiconductor material of the circuits and packaging are virtually identical and substantially all thermally induced fatigues and stresses are minimized or completely eliminated.

Furthermore, according to the capabilities of the present invention, a large number of various devices can be incorporated within a single package, even though each of the devices dissipates dramatically varying amounts of heat, and each of the devices can be isothermally stabilized within an expected range of 1°–5° C. or less.

Although it is presently indefinite, the integration, in theory and in practice, of the circuitry and packaging is expected to lead to other advantages and combinations which are not yet appreciated or exploited.

I claim:

1. An apparatus comprising:
   a closed container of semiconductor material having an interior and exterior surface;
   a plurality of preferentially formed grooves defined at least in part of said interior surface said part being monocrystalline in nature; and
   a fluid disposed in said closed container, said plurality of grooves being wetted, at least in part, by said fluid;
   wherein said closed container communicates with a second closed container being filled with a noncondensable gas.

2. The apparatus of claim 1 wherein said plurality of grooves have a generally "V" shaped cross-section.

3. A carrying apparatus for controlling temerature and in combination with a plurality of heat transferring apparatus disposed thereon, each said heat transferring apparatus comprising:
   a closed container having an interior and exterior surface;
   a plurality of grooves defined at least on part of said interior surface; and
   a first fluid disposed in said closed container, said plurality of grooves being wetted, at least in part, by said first fluid;
   said carrying apparatus including means for removing heat from each of said heat transferring apparatus, said means in thermal contact with each said heat transferring apparatus, wherein said means for removing heat comprises a central conduit and a plurality of perpendicularly extending members thermally coupled to said central conduit, said central conduit being arranged and configured to carry a second fluid therethrough, said heat transferring apparatus being in thermal contact with said plurality of perpendicularly extending members,
   whereby said plurality of heat transferring apparatus may be disposed in a high density arrangement without excess accumulation of heat, and whereby thermal gradients due to the variation in power dissipated among said heat transferring apparatus is reduced and controlled as determined by rate of heat flow between said carrying apparatus and external heat sinks.

4. A carrying apparatus for controlling temperature and in combination with a plurality of heat transferring apparatus disposed thereon, each said heat transferring apparatus comprising:
   a closed container having an interior and exterior surface;
   a plurality of grooves defined at least on part of said interior surface; and
   a first fluid disposed in said closed container, said plurality of grooves being wetted, at least in part, by said first fluid;
   said carrying apparatus including means for removing heat from each of said heat transferring apparatus, said means in thermal contact with each said heat transferring apparatus, wherein said means for removing heat comprises one of said heat transferring apparatus, each remaining one of said multiple of heat transferring being in physical and thermal contact therewith,
   whereby said plurality of heat transferring apparatus may be disposed in a high density arrangement without excess accumulation of heat, and whereby thermal gradients due to the variation in power dissipated among said heat transferring apparatus is reduced and controlled as determined by rate of heat flow between said carrying apparatus and external heat sinks.

5. A carrying apparatus for controlling temperature and in combination with a plurality of heat transferring apparatus disposed thereon, each said heat transferring apparatus comprising:
   a closed container having an interior and exterior surface;
   a plurality of grooves defined at least on part of said interior surface; and
   a first fluid disposed in said closed container, said plurality of grooves being wetted, at least in part, by said first fluid;
   said carrying apparatus including means for removing heat from each of said heat transferring apparatus, said means in thermal contact with each said heat transferring apparatus, wherein said means for removing heat comprises a thermally conductive disc having on a circumferential periphery a plurality of radiating fins, said disc being thermally coupled to at least two of said plurality of heat transferring apparatus, whereby said plurality of heat transferring apparatus may be disposed in a high density arrangement without excess accumulation of heat, and whereby thermal gradients due to the variation in power dissipated among said heat transferring apparatus is reduced and controlled as determined by rate of heat flow between said carrying apparatus and external heat sinks.

6. The carrying apparatus of claim 4 wherein said means for removing heat comprises one of said heat transferring apparatus, each remaining one of said multiple of heat transferring apparatus being in physical and thermal contact therewith.

7. A carrying apparatus for controlling temperature and in combination with a plurality of heat transferring apparatus disposed thereon, each said heat transferring apparatus comprising:
a closed container having an interior and exterior surface;
a plurality of grooves defined at least on part of said interior surface; and
a first disposed in said closed container, said plurality of grooves being wetted, at least in part, by said first fluid;
said carrying apparatus including means for removing heat from each of said heat transferring apparatus, said means in thermal contact with each of said heat transferring apparatus, wherein said means for removing heat comprises means for positioning said multiple of heat transferring apparatus for maximal thermal coupling to a second fluid and for minimal resistance to flow of said second fluid,
whereby said plurality of heat transferring apparatus may be disposed in a high density arrangement without excess accumulation of heat, and whereby thermal gradients due to the variation in power dissipated among said heat transferring apparatus is reduced and controlled as determined by rate of heat flow between said carrying apparatus and external heat sinks.

8. A carrying apparatus for controlling temperature and in combination with a plurality of heat transferring apparatus disposed thereon, each said heat transferring apparatus comprising:
a closed container having an interior and exterior surface;
a plurality of grooves defined at least on part of said interior surface; and
a first fluid disposed in said closed container, said plurality of grooves being wetted, at least in part, by said first fluid;
said carrying apparatus including means for removing heat from each of said heat transferring apparatus, said means in thermal contact with each said heat transferring apparatus, wherein said means for removing heat includes at least one thermoelectric device thermally coupled to said heat transferring apparatus,
whereby said plurality of heat transferring apparatus may be disposed in a high density arrangement without excess accumulation of heat, and whereby thermal gradients due to the variation in power dissipated among said heat transferring apparatus is reduced and controlled as determined by rate of heat flow between said carrying apparatus and external heat sinks.

9. A package for a plurality of electrical devices comprising:
a base; and
a cover disposed over said base, wherein said base has a plurality of cavities defined therein, at least one of said cavities having at least one bus means for communication disposed on a portion of said first base, said portion being of monocrystalline semiconductor material, and leading to a portion of the periphery of said cavity, each said cavity being arranged and configured for the disposition of at least one of said electrical devices therein,
whereby a plurality of electrical devices may be disposed in said package in a high density.

10. The package of claim 9 wherein said plurality of cavities are formed on a second portion of said base wherein said second portion is monocrystalline.

11. The package of claim 9 wherein said bus means includes conductive means for the transmission of electrical signals and optical means for the transmission of optical signals.

12. The package of claim 11 wherein said bus means leads to an edge of at least one of said cavities.
whereby a die including said electrical devices is provided with a mating means for communication and interfacing, and whereby lead-by-lead coupling of said electrical devices to said bus means is substantially reduced.

13. The package of claim 11 wherein said optical means includes at least one optical fiber disposed in a groove preferentially defined in said first portion of said base.

14. The package of claim 11 wherein said optical means includes at least one layer of optically conductive material selectively disposed on said first portion of said base.

15. The package of claim 11 wherein said optical means includes at least one groove preferentially defined in said first portion of said base and optically conductive material disposed within said groove.

16. The package of claim 15 wherein a plurality of said grooves are defined in said base and said cover is disposed over said plurality of grooves, each said groove being separated by an adjacent one of said grooves by an opaque material and said cover, said cover being substantially opaque.

17. The package of claim 11 wherein said plurality of cavities are disposed in a bilateral array in said base, wherein said optical means is disposed along a central area of said bilateral array of cavities, and wherein said electrical means is disposed at least in part on each side of said bilateral array of cavities.

18. The package of claim 17 wherein said electrical and optical means lead to an edge of at least one said cavity, said edge being the closer edge to said central area.

19. The package of claim 17 further comprising a connector including mating optical means for coupling said optical signals from said optical means to an external optical bus.

20. The package of claim 9 further comprising circuit means coupled to said bus means for processing signals communicated through said bus means to and from said plurality of electrical devices, whereby said bus means may be time-shared.

21. The package of claim 20 wherein said circuit means includes optical-to-electrical and electrical-to-optical converters formed in said first portion of said base whereby simple connection to said bus means is effected and a high density of signal lines is achieved in said bus means.

22. The package of claim 20 wherein said bus means includes optical means for the transmission of optical signals to and from said circuit means.

23. The package of claim 20 wherein said circuit means also maintains and processes package operating parameters.

24. The package of claim 9 wherein said cover has a portion of said plurality of electrical devices disposed therein.

25. The package of claim 24 wherein said portion of said plurality of electrical devices disposed in said cover are coupled to a cover bus, said cover bus being coupled to said bus means, said bus means being disposed on said base at an edge of said cover and base.

26. The package of claim 25 wherein a portion of said edge of said cover is removed to permit said cover bus to be coupled to said bus means on said base by fusing a portion of said cover bus to an underlying portion of said bus means on said base.

27. The package of claim 11 wherein said bus means includes a terminal connector comprising:
a first and second mating member for aligning at least said optical means of said package with an external optical means for communicating said optical signal to an external location,
said first mating member being a receptacle formed in said base and cover having at least one guide rail in a fixed positional relationship to said optical means,
said second mating member being a plug having at least one indentation formed therein to engage said guide rail, said indentation having substantially the same positional relationship to said external optical means as said guide rail has to said optical means of said package.

28. The package of claim 27 wherein said guide rail is a cylindrical member disposed in a generally V-shaped groove, and wherein said indentation is a generally V-shaped groove defined in said second mating member.

29. The package of claim 27 wherein said first and second mating members are temporarily and relatively fixed together by at least one rotatable post set in a binding material, said plug disposed in a mating hole defined in said package so that the axis of said hole lies approximately in a plane defined by the interface between said first and second mating members, said binding material disposed in said hole binding said post to said first and second mating members, said binding of said post and first and second mating members being broken by rotation of said post within said hole.

30. A package for a plurality of electrical devices comprising:
a base; and
a cover disposed over said base, wherein said base has a plurality of open cavities defined therein, at least one of said open cavities having at least one conductive bus means for transmitting electrical signals and at least one optical bus means for transmitting optical signals, said conductive and optical bus means leading to a portion of the periphery of at least one said open cavity, each open cavity being arranged and configured for the disposition of at least one of said electrical devices therein, and
wherein said base includes:
at least one closed cavity having an interior surface;
a plurality of grooves defined at least on part of said interior surface; and
a fluid disposed in said at least one closed cavity, at least part of said plurality of grooves being wetted by said fluid,
whereby a package is formed having high heat dissipation capacity and high physical capacity for a large number of signal inputs and outputs.

* * * * *